(12) United States Patent
Notsu et al.

(10) Patent No.: US 11,784,201 B2
(45) Date of Patent: Oct. 10, 2023

(54) PACKAGE AND SEMICONDUCTOR DEVICE

(71) Applicant: CANON KABUSHIKI KAISHA, Tokyo (JP)

(72) Inventors: Kazuya Notsu, Kanagawa (JP); Ayako Furesawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 126 days.

(21) Appl. No.: 17/186,164

(22) Filed: Feb. 26, 2021

(65) Prior Publication Data
US 2022/0278149 A1    Sep. 1, 2022

(30) Foreign Application Priority Data

Feb. 28, 2020    (JP) .................................. 2020-033756

(51) Int. Cl.
*H01L 27/146*    (2006.01)
*H01L 23/498*    (2006.01)
(Continued)

(52) U.S. Cl.
CPC ...... *H01L 27/14618* (2013.01); *H01L 23/055* (2013.01); *H01L 23/49811* (2013.01); *H01L 23/49827* (2013.01); *H01L 23/49838* (2013.01); *H01L 24/16* (2013.01); *H01L 23/49* (2013.01); *H01L 24/13* (2013.01); *H01L 24/45* (2013.01); *H01L 24/48* (2013.01); *H01L 24/73* (2013.01); *H01L 24/81* (2013.01); *H01L 2224/1318* (2013.01); *H01L 2224/13144* (2013.01); *H01L 2224/13155* (2013.01); *H01L 2224/13184* (2013.01); *H01L 2224/16227* (2013.01); *H01L 2224/45124* (2013.01); *H01L 2224/45139* (2013.01); *H01L 2224/45144* (2013.01); *H01L 2224/45147* (2013.01); *H01L 2224/48227* (2013.01); *H01L 2224/73257* (2013.01); *H01L 2224/81201* (2013.01)

(58) Field of Classification Search
CPC .................................................. H01L 27/14618
See application file for complete search history.

(56) References Cited

U.S. PATENT DOCUMENTS 10,831,235 B2    11/2020 Katase et al.
2020/0029039 A1*    1/2020 Nozu ................... H05K 1/0298

FOREIGN PATENT DOCUMENTS

| JP | 2007-234960 A | 9/2007 |
| JP | 2015-167319 A | 9/2015 |
| JP | 2017-188040 A | 10/2017 |

* cited by examiner

*Primary Examiner* — William A Harriston
(74) *Attorney, Agent, or Firm* — Venable LLP

(57) ABSTRACT

A package comprising a base is provided. An electrode and a concave portion are arranged on a first surface of the package. The base comprises a second surface on a side opposite to the first surface and a third surface. The first surface is positioned between the second and third surfaces. The electrode comprises an electrode upper surface and an electrode side surface. The concave portion comprises a concave side surface and a bottom surface positioned closer to the second surface than the concave side surface. The electrode upper surface is arranged at a position further away from the virtual plane than the bottom surface. The electrode side surface is continuous with the concave side surface. The concave portion further comprises a second side surface which faces the concave side surface and is continuous with the third surface.

21 Claims, 8 Drawing Sheets

(51) Int. Cl.
*H01L 23/055* (2006.01)
*H01L 23/49* (2006.01)
*H01L 23/00* (2006.01)

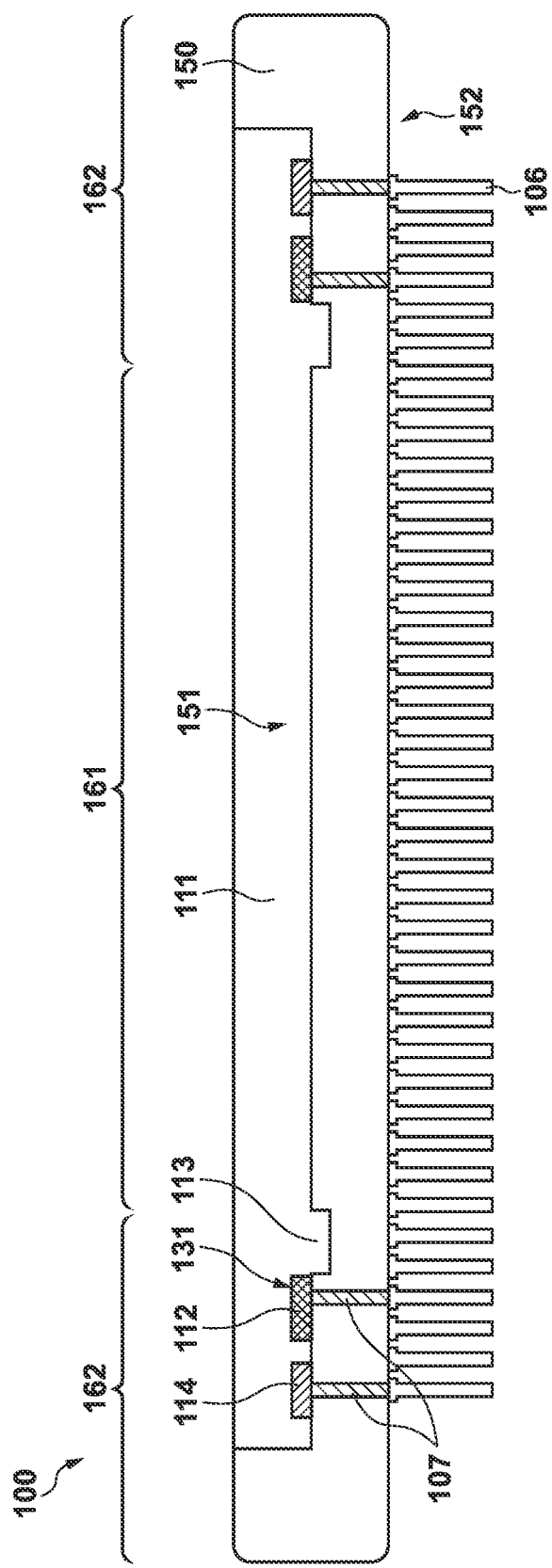

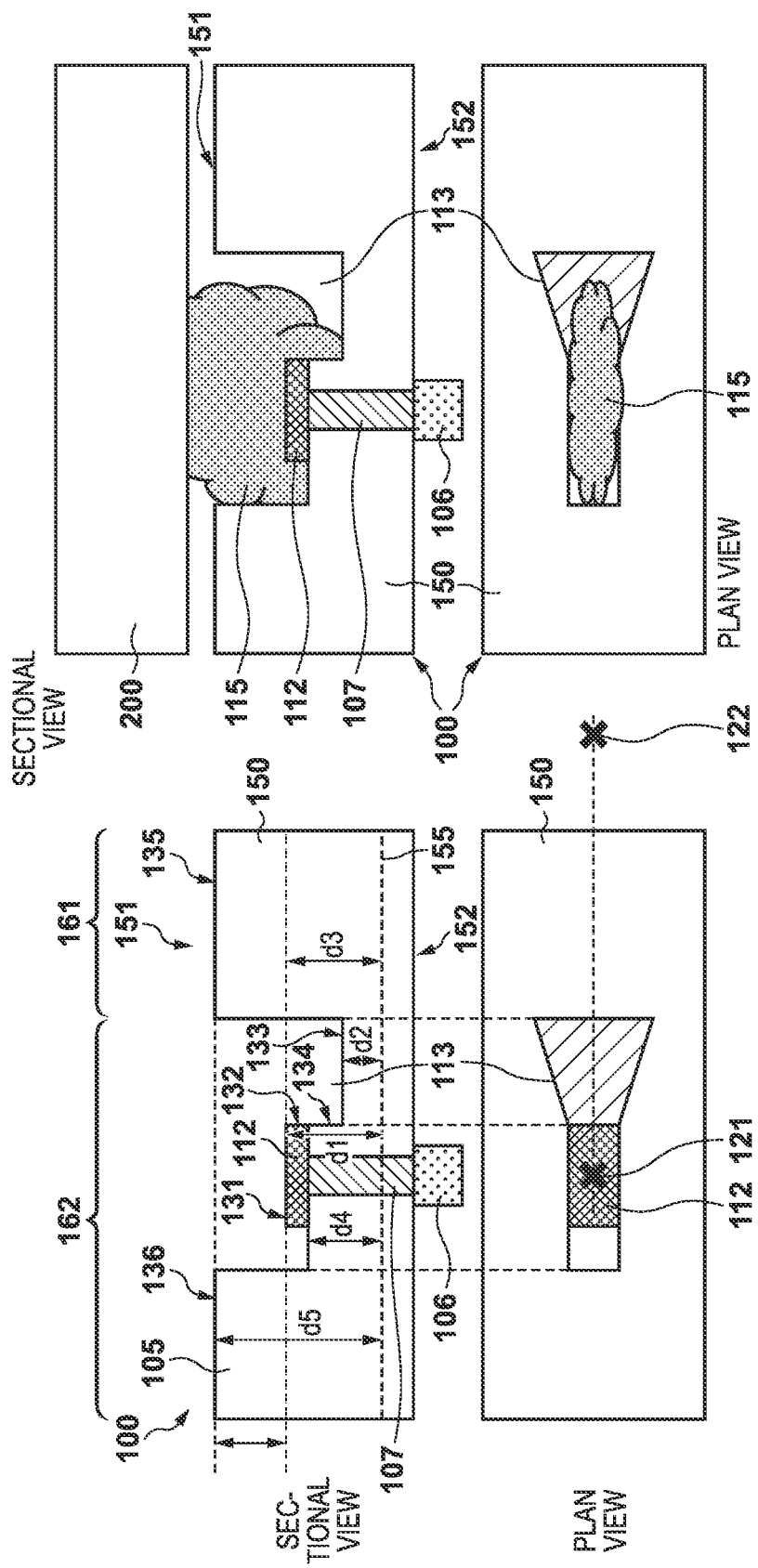

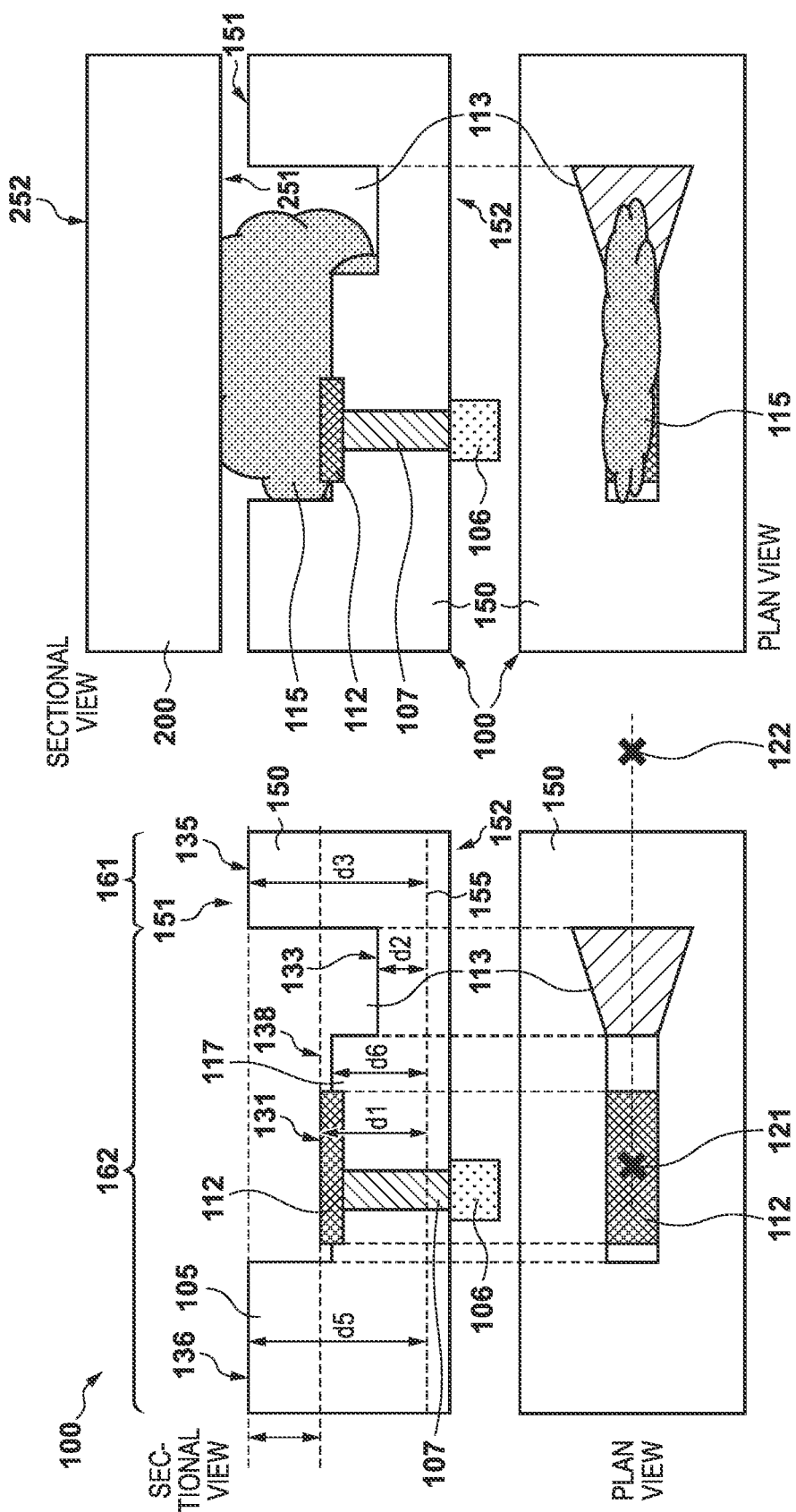

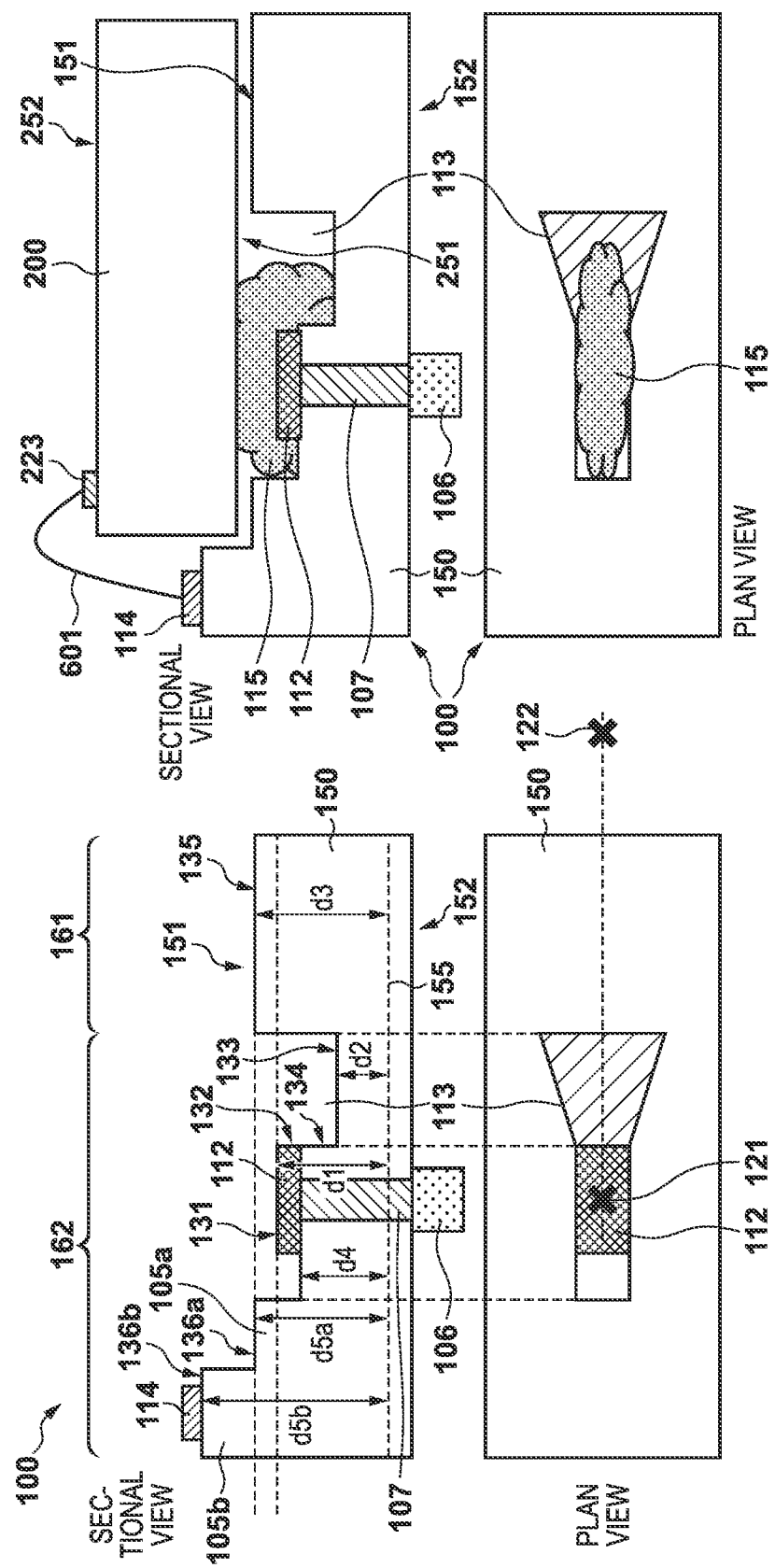

PACKAGE AND SEMICONDUCTOR DEVICE

BACKGROUND OF THE INVENTION

Field of the Invention

The present invention relates to a package and a semiconductor device.

Description of the Related Art

Japanese Patent Laid-Open No. 2017-188040 discloses an IC card in which an IC module including an IC chip has been mounted on a card base. When mounting the IC module on the card base, a conductive paste can be prevented from extruding from between the IC module and the card base by arranging a weir portion around the peripheral portion of the IC module to block conductive paste and push out the conductive paste to a second concave portion.

SUMMARY OF THE INVENTION

When an electronic device is to be mounted on a package, the respective surfaces, of the package and the electronic device, which face each other may be bonded by using a conductive bonding member.

Some embodiments of the present invention provide a technique advantageous in mounting an electronic device on a package.

According to some embodiments, a package comprising a base configured to mount an electronic device, wherein an electrode and a concave portion provided in the base are arranged on a first surface of the package, the base comprises a second surface on a side opposite to the first surface and a third surface, and the first surface is positioned between the second surface and the third surface, the electrode comprises an electrode upper surface which is a surface on a side opposite to the side of the second surface, and an electrode side surface which is a surface in a direction that intersects with a virtual plane between the first surface and the second surface, the concave portion comprises a side surface, of the concave portion, which is a surface in the direction that intersects with the virtual plane, and a bottom surface, of the concave portion, which is positioned closer to the side of the second surface than the side surface of the concave portion, the electrode upper surface is arranged at a position further away from the virtual plane than the bottom surface of the concave portion, the electrode side surface is continuous with the side surface of the concave portion, and the concave portion further comprises a second side surface which faces the side surface of the concave portion and is continuous with the third surface, is provided.

According to some other embodiments, a package comprising a base configured to mount an electronic device, wherein an electrode, a concave portion provided in the base, and a middle portion which is formed by the base and is positioned between the electrode and the concave portion in an orthogonal projection with respect to a first surface are arranged on the first surface of the package, the base comprises a second surface on a side opposite to the first surface and a third surface, and the first surface is positioned between the second surface and the third surface, the electrode comprises an electrode upper surface which is a surface on a side opposite to the side of the second surface, and an electrode side surface which is a surface in a direction that intersects with a virtual plane between the first surface and the second surface, the concave portion comprises a side surface, of the concave portion, which is a surface in the direction that intersects with the virtual plane, and a bottom surface, of the concave portion, which is positioned closer to the side of the second surface than the side surface of the concave portion, the middle portion comprises a middle upper surface which is a surface on the side opposite to the side of the second surface, the electrode upper surface and the middle upper surface are arranged at a position further away from the virtual plane than the concave portion bottom surface, a distance from the virtual plane to the middle upper surface does not exceed a distance from the virtual plane to the electrode upper surface, a distance from the electrode to the concave portion is shorter than a length of the electrode in a direction in which the electrode and the concave portion are connected, and the concave portion further comprises a second side surface which faces the side surface of the concave portion and is continuous with the third surface, is provided.

According to still other embodiments, a semiconductor device comprising an electronic device, a package including a first surface on which the electronic device is mounted, a second surface on a side opposite to the first surface, and a third surface, and a cover member configured to cover the electronic device, wherein an electrode that comprises an electrode upper surface that faces the electronic device is arranged on the first surface, the first surface is positioned between the second surface and the third surface, the electrode is electrically connected, via a conductive member, to a surface, of surfaces included in the electronic device, which faces the first surface, the first surface includes the electrode and a concave portion, the concave portion comprises a side surface, of the concave portion, which is a surface in a direction that intersects with a virtual plane between the first surface and the second surface, a bottom surface, of the concave portion, which is positioned closer to the side of the second surface than the side surface of the concave portion, and a second side surface which faces the side surface of the concave portion and is continuous with the third surface, the electrode upper surface is arranged at a position further away from the virtual plane than the bottom surface of the concave portion, the conductive member flows into the concave portion, and the cover member is bonded to a convex portion provided on a peripheral portion of the first surface, is provided.

Further features of the present invention will become apparent from the following description of exemplary embodiments (with reference to the attached drawings).

BRIEF DESCRIPTION OF THE DRAWINGS

FIG. 1 is a sectional view showing an example of the arrangement of a package according to an embodiment;

FIGS. 3A and 3B each show a sectional view and a plan view showing an example of the arrangement near the electrode of the package of FIG. 1;

FIGS. 5A and 5B each show a sectional view and a plan view showing an example of the arrangement near the electrode of the package of FIG. 1;

FIGS. 6A and 6B each show a sectional view and a plan view showing an example of the arrangement near the electrode of the package of FIG. 1;

DESCRIPTION OF THE EMBODIMENTS

Figure 2B:
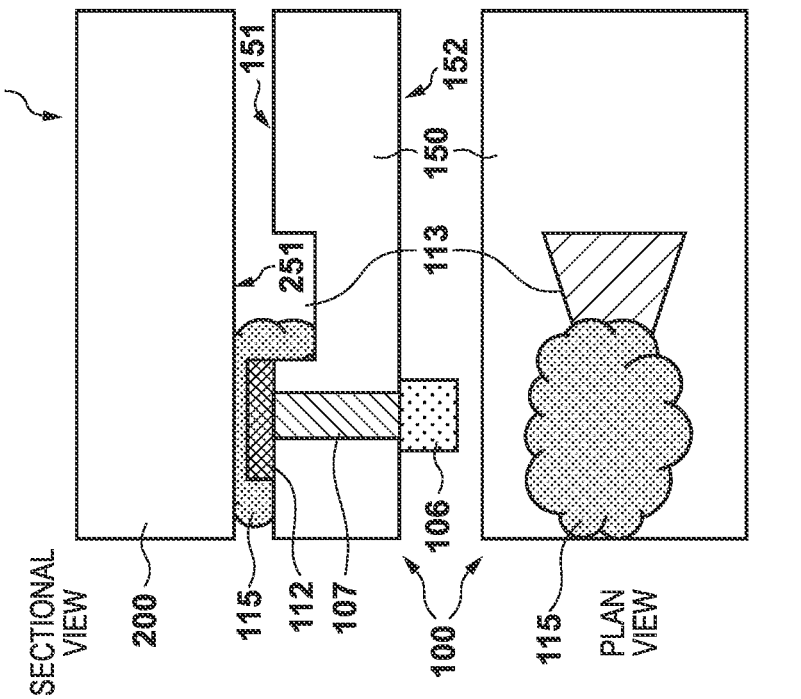
FIGS. 2A and 2B each show a sectional view and a plan view showing an example of an arrangement near an electrode of the package of FIG. 1.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 2A:
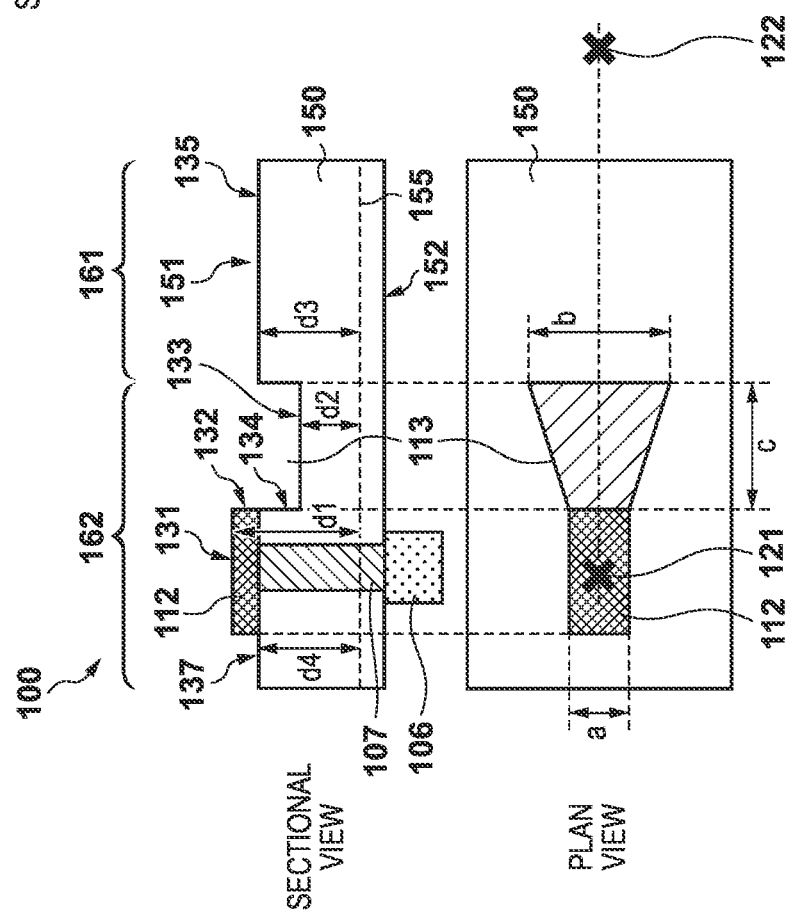

The arrangements of a package and a semiconductor device according to an embodiment disclosed in the present invention will be described with reference to FIGS. 1 to 8. FIG. 1 is a sectional view showing an example of the arrangement of a package 100 according to this embodiment. FIG. 2A shows a sectional view and a plan view in which the vicinity of an electrode 112 of FIG. 1 has been enlarged. FIG. 2B shows a sectional view and a plan view when an electronic device 200 has been mounted on the package 100. The package 100 is fabricated by using, for example, a ceramic, a printed board, plastic, or the like.

The package 100 includes a base 150 provided with a cavity 111 for mounting the electronic device 200. The electrode 112 and a concave portion 113 provided in the base 150 are arranged on a surface 151 of the package 100 (base 150). The base 150 includes a surface 152 on a side opposite to the surface 151. The surface 152 can be referred to as the lower surface of the base 150. The electrode 112 includes an upper surface 131 (electrode upper surface) which is a surface on a side opposite to the side of the surface 152 and side surfaces 132 (electrode side surfaces) which are surfaces in a direction which intersects with a virtual plane (to be also referred to as a reference plane 155 in some cases hereinafter) between the surface 151 and the surface 152. Although details will be described in detail later, the electrode 112 faces the electronic device 200 and is electrically connected, via a conductive member 115, to a surface 251 which faces the surface 151 of the surfaces included in the electronic device 200. The concave portion 113 includes side surfaces 134 (side surfaces of the concave portion), which are surfaces in a direction intersecting with the reference plane 155, and a bottom surface 133 (bottom surface of the concave portion) positioned closer to the side of the surface 152 than the side surfaces 134. Angles formed here between the reference plane 155 and the respective surfaces of the side surfaces 134 of the concave portion 113 may be the same or different from each other.

In the semiconductor device, the conductive member 115 is applied on the electrode 112 when the electronic device 200 is to be mounted, and the conductive member 115 that extruded flows into the concave portion 113 when the electronic device 200 is compression-bonded from the upper side. In addition, a terminal 114 for electrically connecting to an external terminal 223 (see FIG. 8), which is arranged on a surface 252 on a side opposite to the surface 251 facing the surface 151 of the surfaces included in the electronic device 200, is arranged on the surface 151. The terminal 114 is electrically connected to the external terminal 223 of the electronic device 200 by a wire using gold, silver, copper, aluminum, an alloy of these metals, or the like. The electrode 112 and the terminal 114 are electrically connected to external terminals 106, of the package 100, which are arranged on the surface 152 of the base 150. The electrode 112 and the terminal 114 are made of a conductive material such as a metal, for example, tungsten, molybdenum, nickel, gold, or the like, and are formed by plating or the like. Here, the reference plane 155 can be a virtual line that passes through the base 150 between the surface 151 and the surface 152. The reference plane 155 may also be, for example, a surface parallel to the bottom surface 133 of the concave portion 113. In addition, if the surface 152 of the base 150 is flat, the reference plane 155 may be a plane parallel to the surface 152.

A more specific formation method of the cavity 111, the concave portion 113, and the electrode 112 will be described by the example of a ceramic package. A metal mold or the like is used to form the cavity 111 and vias (holes), which are to be electrically connected to the electrode 112 and the terminal 114, on a green sheet made by kneading a ceramic material and a binder. Each via is filled with a conductive member 107 made of a conductive material such as tungsten, molybdenum, or the like. Thereafter, a wiring pattern (not shown) is printed and stacked to electrically connect the electrode 112 and the terminal 114 to the external terminals 106 via the corresponding conductive members 107. Subsequently, after dicing and firing, the electrode 112 and the terminal 114 are plated by using electroplating, electroless plating, or the like. In the case of a plastic package, the concave portion 113 will be formed by mold formation and a cutting process. In addition, in a case in which a printed board is to be used, the concave portion 113 can be formed by attaching a frame member fabricated from plastic or the like on the printed board by an adhesive agent. The external terminals 106 are electrodes for electrically connecting with the outside of the package 100, and may generally be in the form of an LCC (Leadless Chip Carrier), an LGA (Land Grid Array), a PGA (Pin Grid Array), or the like.

The upper surface 131 of the electrode 112 is arranged at a position further away from the reference plane 155 than the bottom surface 133 of the concave portion 113. In other words, a distance d1 from the reference plane 155 to the upper surface 131 of the electrode 112 is longer than a distance d2 from the reference plane 155 to the bottom surface 133 of the concave portion 113. Here, assume that a thickness direction is a direction in which the surface 151 and the surface 152 are connected, that is, the vertical direction of the sectional view shown in each of FIGS. 1, 2A, and 2B, which is the direction that intersects with (perpendicular to) the paper surface in the plan view shown in each of FIGS. 2A and 2B. At this time, the upper surface 131 of the electrode 112 may be arranged at a position further away from the surface 152 than the bottom surface 133 which is in the direction that intersects with the thickness direction of the concave portion 113. It can be said that the upper surface 131 of the electrode 112 is arranged at a position shallower than the bottom surface 133 of the concave portion 113 in the thickness direction. In addition, a single plane is formed by the side surface 132, on side of the concave portion 113, of the side surfaces along the thickness direction of the electrode 112 and the side surface 134, on the side of the electrode 112, of the side surfaces along the thickness direction of the concave portion 113. In other words, the end face of the concave portion 113 and the end face of the electrode 112 exposed in the thickness direction are formed in planarly contacting positions, and the side surface 132 of the electrode 112 continues to the side surface 134 of the concave portion 113.

When the electrode 112 and the surface 251 of the electronic device 200 are to be connected, the conductive member 115 made by using a conductive adhesive agent or the like is applied on the electrode 112. Subsequently, the electrode 112 and the electronic device 200 are connected by compression-bonding the electronic device 200 from above the surface 151. When compression-bonding the electronic device 200, the conductive member 115 that has extruded from the upper surface 131 of the electrode 112 will flow into the concave portion 113 which is adjacent to the electrode 112. This will suppress the conductive member 115 from wetting and spreading over a wide range. That is, when the electronic device 200 is to be mounted on the package 100, the spread of the conductive member 115 which is used to bond the package 100 and the electronic device 200 can be controlled more easily. As a result, it is possible to improve the yield by reducing the occurrence of short circuits caused by the conductive member 115 spreading more than necessary, and to implement downsizing of the package 100 by reducing the margin of the wetting and spreading of the conductive member 115.

Here, as shown in FIG. 1, a portion, of the surface 151, where the electrode 112 and the concave portion 113 are arranged will be referred to as a peripheral portion 162 and a portion which is closer to the inner side than the peripheral portion 162 will be referred to as a central portion 161. The central portion 161 can be considered to be a portion closer to the center of the surface 151 than the peripheral portion 162. The concave portion 113 is arranged between the electrode 112 and the central portion 161. Also, as shown in FIG. 2A, the concave portion 113 may be arranged between a center 121 of the electrode and a center 122 of the surface 151. The center of the surface 151 here may be the center of the package 100 in an orthogonal projection with respect to the surface 151 or may be the center of the cavity 111, of the package 100, on which the electronic device 200 is to be mounted. In the arrangement shown in FIG. 1, the center of the package 100 and the center of the cavity 111 can be at the same position. Alternatively, in a case in which the target object is a rectangle, the center may be a portion where diagonal lines intersect or may be a position at the geometric centroid.

Also, in an orthogonal projection with respect to the surface 151, the width of the concave portion 113 in a direction that intersects with the direction in which the electrode 112 and the concave portion 113 are connected may be set to be the same or to increase continuously or in stages in a direction from the electrode 112 to the concave portion 113. At this time, in an orthogonal projection with respect to the surface 151, the width of the concave portion 113, in the direction that intersects with the direction in which the center 121 of the electrode 112 and the center 121 of the surface 151 are connected, may be set to be the same or to increase continuously or in stages in the direction from the electrode 112 to the center 122 of the surface 151. For example, as shown in FIG. 2A, let a be a width, of the concave portion 113, on the side of the electrode 112 in the direction that intersects with the direction in which the center 121 of the electrode 112 and the center 121 of the surface 151 are connected, and let b be a width, of the concave portion 113, on the side of the center 122 (the side of the central portion 161) of the surface 151. In this case, by forming the concave portion 113 so as to set a relationship in which a b, a length c in the direction from the electrode 112 to the concave portion 113 can be reduced when compared to the concave portion 113 which has the same area. As a result, it will be possible to suppress the extrusion of the conductive member 115 in a direction toward the center 122 of the package 100 to a smaller range. FIG. 2A shows a case in which the width of the concave portion 113 continuously increases in the direction from the electrode 112 toward the concave portion 113 (toward the center 122 of the package 100).

In addition, the central portion 161 includes an upper surface 135 (central upper surface) which is a surface on a side opposite to the side of the surface 152, and a distance d3 from the reference plane 155 to the upper surface 135 of the central portion 161 may be the same as a distance d4 from the reference plane 155 to an upper surface 137 of a portion, of the peripheral portion 162, on which the electrode 112 is arranged. In other words, an additional concave portion need not be arranged in the central portion 161. As a result, the process of fabricating the package 100 will become easier than in a case in which an additional concave portion is to be fabricated in the central portion 161, thus improving the yield in the manufacture of the package 100.

FIGS. 3A and 3B each show a sectional view and a plan view showing the modification of FIGS. 2A and 2B. An outer peripheral portion 105, of the peripheral portion 162, which is further on a side opposite to the central portion 161 than the electrode 112 includes an upper surface 136 (outer peripheral upper surface) which is a surface on a side opposite to the side of the surface 152 and is arranged in a position higher than the upper surface 137 of the portion, of the peripheral portion 162, on which the electrode 112 is arranged. Here, a distance d5 from the reference plane 155 to the upper surface 136 of the outer peripheral portion 105 is equal to or longer than the distance d1 from the reference plane 155 to the upper surface 131 of the electrode 112. The distance from the surface 152 of the base 150 to the upper surface 136 of the outer peripheral portion 105 may be equal to or longer than the distance from the surface 152 to the upper surface 131 of the electrode 112. Also, as shown in FIGS. 3A and 3B, the distance d5 from the reference plane 155 to the upper surface 136 of the outer peripheral portion 105 may be equal to the distance d3 from the reference plane 155 to the upper surface 135 of the central portion 161. In a similar manner, the distance from the surface 152 of the base 150 to the upper surface 136 of the outer peripheral portion 105 may be equal to the distance from the surface 152 to the upper surface 135 of the central portion 161. By setting the upper surface 136 of the outer peripheral portion 105 and the upper surface 135 of the central portion 161 at the same height, the number of processes to be performed at the fabrication of the package 100 can be suppressed. The terminal 114 for electrically connecting to the external terminal 223, which is arranged on the surface 252 opposite to the surface 251 which faces the surface 151 among the surfaces included in the electronic device 200, can be arranged on the upper surface 136 of the outer peripheral portion 105 (see FIGS. 6A and 6B).

Compared to the arrangement shown in FIGS. 2A and 2B, the distance d3 from the reference plane 155 to the upper surface 135 of the central portion 161 is longer than the distance d1 from the reference plane 155 to the upper surface 131 of the electrode 112 in the arrangement shown in FIGS. 3A and 3B. That is, the upper surface 135 of the central portion 161 is arranged at a higher position than the position of the upper surface 131 of the electrode 112. As a result, the effect of suppressing the extrusion of the conductive member 115 in the direction from the electrode 112 to the center 122 of the surface 151 will be equal to or more than that of the arrangement shown FIGS. 2A and 2B. In addition, since the upper surface 136 of the outer peripheral portion 105 is arranged at a position higher than the position of the upper surface 131 of the electrode 112, it will be possible to suppress the conductive member 115 from extruding from the electrode 112 to the outside of the surface 151. As a result, it will be possible to minimize the area in which the conductive member 115 will extrude. Therefore, it will be possible to improve the yield when the electronic device 200 is to be mounted on the package 100, and to implement downsizing of the package 100.

Figure 4A:
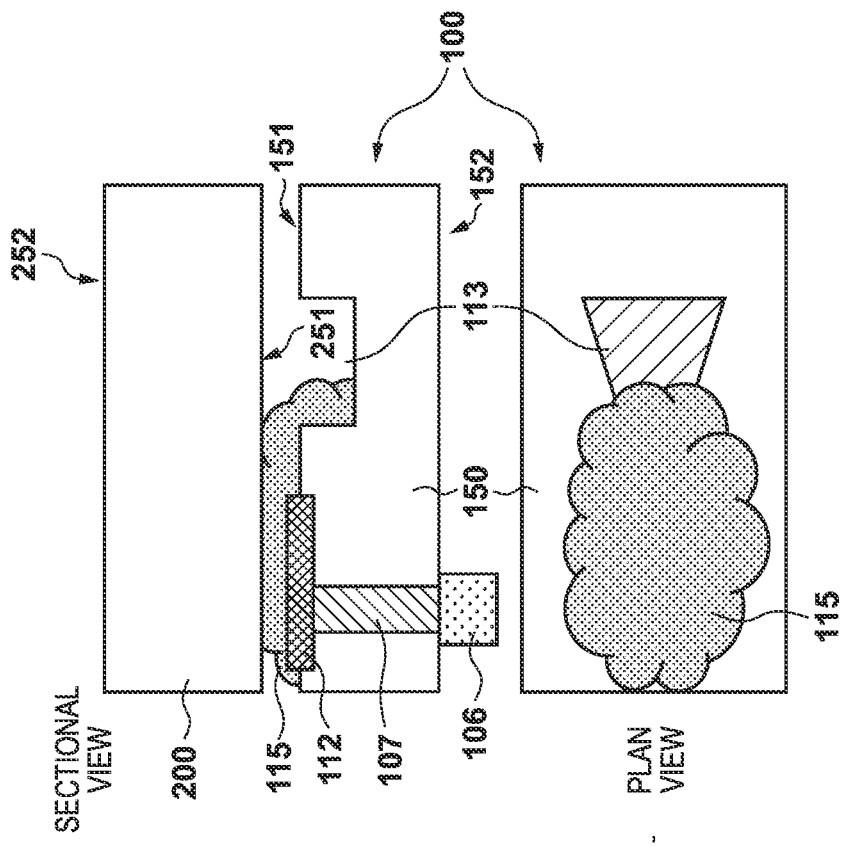
FIGS. 4A and 4B each show a sectional view and a plan view showing an example of the arrangement near the electrode of the package of FIG. 1.
Figure 4B:
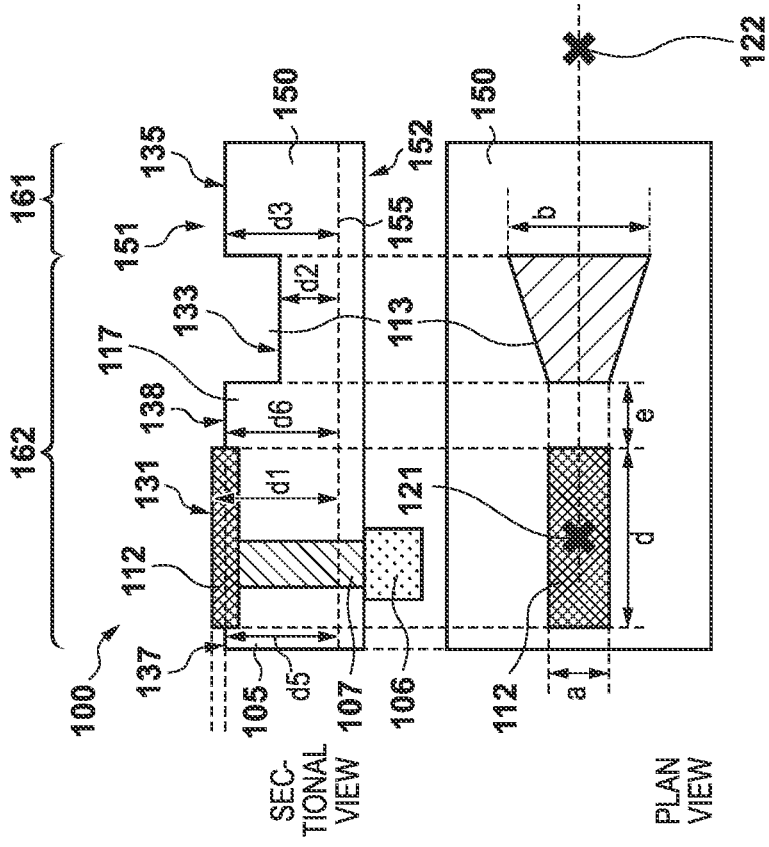

FIGS. 4A and 4B each are a sectional view and a plan view showing a further modification of the vicinity of the electrode 112. Compared to the arrangement shown in FIGS. 2A and 2B, the surface 151 includes, in addition to the concave portion 113 arranged adjacent to the electrode 112, a middle portion 117 which is arranged between the electrode 112 and the concave portion 113 in the arrangement shown in FIGS. 4A and 4B. In other words, the electrode 112, the concave portion 113 provided in the base 150, and the middle portion 117, which is formed by the base 150 and is positioned between the electrode 112 and the concave portion 113 in an orthogonal projection to the surface 151, are arranged on the surface 151 of the package 100. At this time, the middle portion 117 includes an upper surface 138 (middle upper surface) which is a surface on a side opposite to the side of the surface 152, and the upper surface 138 of the middle portion 117 is arranged at a position further away from the reference plane 155 than the bottom surface 133 of the concave portion 113. In addition, a distance d6 from the reference plane 155 to the upper surface 138 of the middle portion 117 does not exceed the distance from the reference plane 155 to the upper surface 131 of the electrode 112. Also, the distance from the surface 152 of the base 150 to the upper surface 138 of the middle portion 117 may be equal to or shorter than the distance from the surface 152 to the upper surface 131 of the electrode 112 and be longer than the distance from the surface 152 to the bottom surface 133 of the concave portion 113. That is, the upper surface 138 of the middle portion 117 is arranged at a height between the upper surface 131 of the electrode 112 and the bottom surface 133 of the concave portion 113. At this time, in an orthogonal projection to the surface 151, a distance e from the electrode 112 to the concave portion 113 may be shorter than the length of the electrode 112 in the direction in which the electrode 112 and the concave portion 113 are connected (for example, the direction in which the center of the electrode 112 and the center of the concave portion 113 are connected).

The distance d6 from the reference plane 155 to the upper surface 138 of the middle portion 117 may be equal to the distance d3 from the reference plane 155 to the upper surface 135 of the central portion 161. In addition, the distance from the surface 152 of the base 150 to the upper surface 138 of the middle portion 117 may be equal to the distance from the surface 152 of the base 150 to the upper surface 135 of the central portion 161. That is, the upper surface 138 of the middle portion 117 and the upper surface 135 of the central portion 161 may be arranged at the same height. Also, the distance d6 from the reference plane 155 to the upper surface 138 of the middle portion 117 may be equal to the distance d5 from the reference plane 155 to the upper surface 137 of a portion, of the peripheral portion 162, where the electrode 112 is arranged. That is, the middle portion 117 and the portion, of the peripheral portion 162, where the electrode 112 is arranged can be arranged at the same height. Furthermore, the upper surface 135 of the central portion 161, the upper surface 138 of the middle portion 117, and the upper surface 137 of the portion, of the peripheral portion 162, where the electrode 112 may be arranged at the same height. As a result, the number of processes to be performed at the fabrication of the package 100 can be suppressed.

In the arrangement disclosed in Japanese Patent Laid-Open No. 2017-188040, a member is arranged, between the electrode 112 and the concave portion 113, to a position higher than the upper surface 131 of the so that it will be difficult for the extruded conductive member 115 to flow into the concave portion 113. In contrast, in the arrangement shown in FIGS. 4A and 4B, since the middle portion 117 is arranged at the same height or at a position lower than the upper surface 131 of the electrode 112 so as not to exceed the upper surface 131 of the electrode 112, the extruded conductive member 115 can flow into the concave portion 113 more easily, and the extruded conductive member 115 can be controlled more easily. In addition, in a similar manner to that described above, the width of the concave portion 113, in the direction that intersects with the direction in which the electrode 112 and the concave portion 113 are connected, may be set to be the same or to increase (a≤b) continuously or in stages as the distance increases from the electrode 112.

FIGS. 5A and 5B each show a sectional view and a plan view showing a modification of FIGS. 4A and 4B. In a manner similar to the arrangement shown in FIGS. 3A and 3B with respect to the arrangement shown in FIGS. 2A and 2B, the outer peripheral portion 105, of the peripheral portion 162, which is further on a side opposite to the central portion 161 than the electrode 112 can include the upper surface 136, which is a surface on a side opposite to the side of the surface 152 and is arranged at a position higher than the upper surface 137, of the peripheral portion 162, of the portion on which the electrode 112 is arranged. As shown in FIGS. 5A and 5B, the distance d5 from the reference plane 155 to the upper surface 136 of the outer peripheral portion 105 may be equal to the distance d3 from the reference plane 155 to the upper surface 135 of the central portion 161. In addition, the distance from the surface 152 of the base 150 to the upper surface 136 of the outer peripheral portion 105 may be equal to the distance from the surface 152 to the upper surface 135 of the central portion 161. By arranging the upper surface 136 of the outer peripheral portion 105 and the upper surface 135 of the central portion 161 at the same height, the number of processes to be performed at the fabrication of the package 100 can be suppressed. The terminal 114 for electrically connecting to the external terminal 223, which is arranged on the surface 252 which is on a side opposite to the surface 251 facing the surface 151 among the surfaces included in the electronic device 200, may be arranged on the upper surface 136 of the outer peripheral portion 105.

Compared to the arrangement shown in FIGS. 4A and 4B, the upper surface 135 of the central portion 161 is arranged at a position higher than the upper surface 131 of the electrode 112 in the arrangement shown in FIGS. 5A and 5B. As a result, the effect of suppressing the extrusion of the conductive member 115 in the direction from the electrode 112 to the center 122 of the surface 151 will be equal to or more than that of the arrangement shown in FIGS. 4A and 4B. In addition, since the upper surface 136 of the outer peripheral portion 105 is arranged at a position higher than the upper surface 131 of the electrode 112, it will be possible to suppress the conductive member 115 from extruding from the electrode 112 to the outside of the surface 151. As a result, it will be possible to minimize the area in which the conductive member 115 will extrude. Therefore, it will be possible to improve the yield when the electronic device 200 is to be mounted on the package 100, and to implement downsizing of the package 100.

In addition, the outer peripheral portion 105 is not limited to an arrangement in which it forms a single step as shown in FIGS. 3A, 3B, 5A, and 5B.

FIGS. 6A and 6B each show a sectional view and a plan view showing a modification of FIGS. 3A and 3B. The outer peripheral portion 105, of the peripheral portion 162, which is further on a side opposite to the central portion 161 than the electrode 112 includes the upper surface 136 (outer peripheral upper surface), which is a surface on a side opposite to the side of the surface 152. The outer peripheral portion 105 can include an outer peripheral portion 105a in which a distance d5a, from the reference plane 155 to an upper surface 136a which is a surface on a side opposite to the side of the surface 152, is longer than the distance d1, from the reference plane 155 to the upper surface 131 of the electrode 112, and an outer peripheral portion 105b in which a distance d5b, from the reference plane 155 to an upper surface 136b which is arranged further on a side opposite to the central portion 161 than the outer peripheral portion 105a and is a surface on a side opposite to the side of the surface 152, is longer than the distance d5a from the reference plane 155 to the upper surface 136a. At this time, in the outer peripheral portion 105a, the distance from the surface 152 of the base 150 to the upper surface 136a may be longer than the distance from the surface 152 to the upper surface 131 of the electrode 112. In addition, in the outer peripheral portion 105b, the distance from the surface 152 to the upper surface 136b may be longer than the distance from the surface 152 to the upper surface 136a of the outer peripheral portion 105a.

At this time, as shown in FIGS. 6A and 6B, the terminal 114 for electrically connecting to the external terminal 223, which is arranged on the surface 252 opposite to the surface 251 which faces the surface 151 among the surfaces included in the electronic device 200, can be arranged on the upper surface 136b of the outer peripheral portion 105b. The terminal 114 of the package 100 and the external terminal 223 of the electronic device 200 can be connected by a wire 601 such as a gold wire or the like.

In addition, as shown in FIGS. 6A and 6B, the distance d5a from the reference plane 155 to the upper surface 136a of the outer peripheral portion 105a may be equal to the distance d3 from the reference plane 155 to the upper surface 135 of the central portion 161. Even in a case in which the outer peripheral portion 105 is formed by two steps or more, the upper surface 136a of the outer peripheral portion 105a and the upper surface 135 of the central portion 161 can be arranged at the same height to suppress the number of processes to be performed at the fabrication of the package 100 from increasing.

Also, in the arrangement shown in FIGS. 6A and 6B as well, the upper surface 136a of the outer peripheral portion 105a and the upper surface 136b of the outer peripheral portion 105b will be arranged at a position higher than the upper surface 131 of the electrode 112. Hence, it will be possible to suppress the conductive member 115 from extruding from the electrode 112 to the outside of the surface 151.

Figures 7A, 7B:
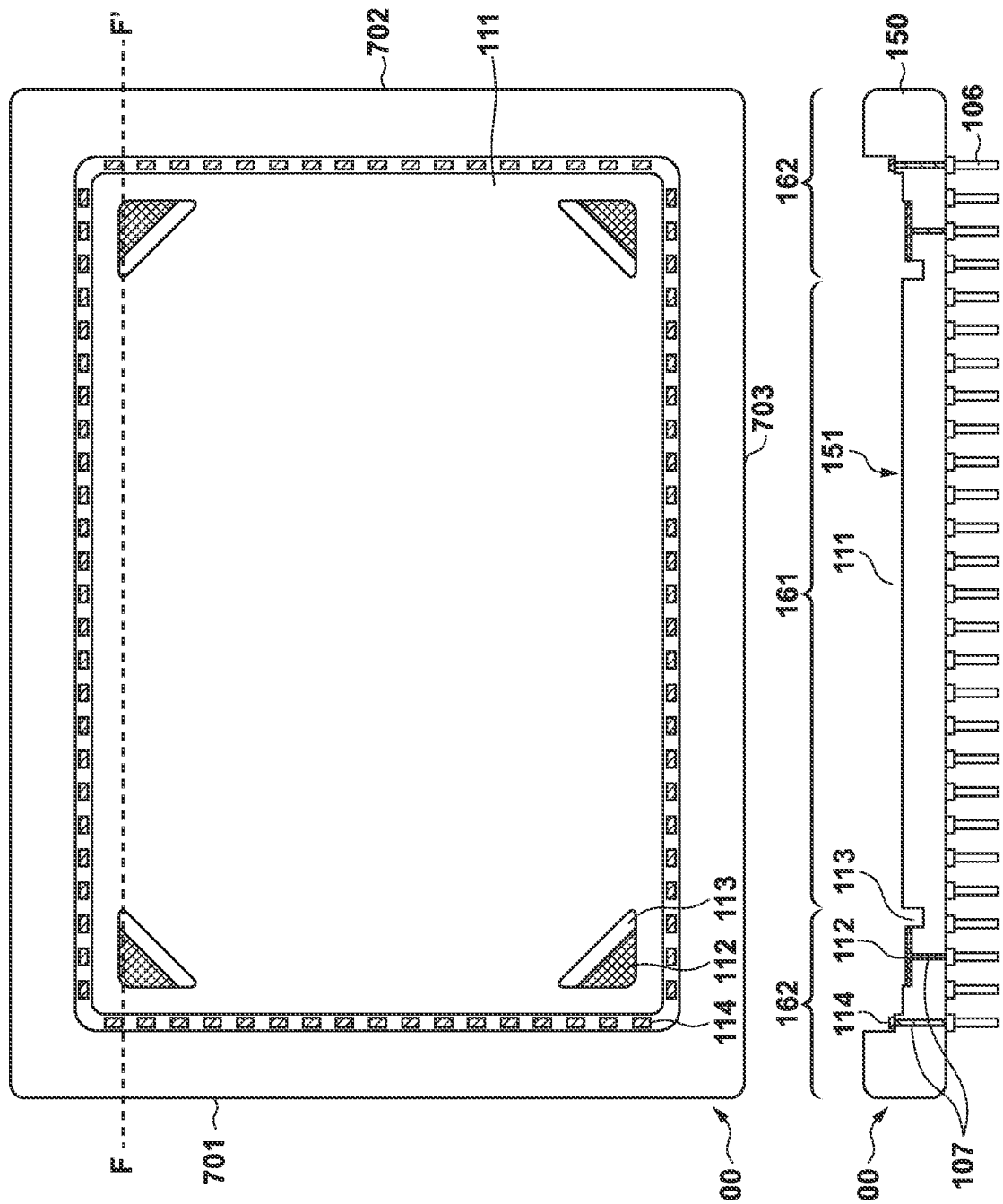
FIGS. 7A and 7B are a plan view showing an example of the arrangement of the package of FIG. 1 and a sectional view showing the arrangement of the package of FIG. 1, respectively.

Although the arrangement of the package 100 has been described above by mainly focusing on the electrode 112 and the concave portion 113, the overall arrangement of the package 100 will be described next with reference to FIGS. 7A and 7B. FIG. 7A is a plan view of the package 100, and FIG. 7B is a sectional view taken along a line F-F' in FIG. 7A.

As shown in FIG. 7A, each electrode 112 and each concave portion 113 may have a shape in which the width monotonically increases toward the center of the surface 151 so that an excessive portion of the conductive member 115 will easily flow to the concave portion 113 when the material of the conductive member 115 is applied on the electrode 112. More specifically, each electrode 112 and each concave portion 113 may have a triangular shape. That is, in an orthogonal projection with respect to the surface 151, the surface 151 (cavity 111) has a rectangular shape including a side 701 and a side 702 which are parallel to each other and a side 703 which extends in a direction that intersects with the side 701 and the side 702. At this time, each electrode 112 may be arranged in a corresponding corner portion of the surface 151 (cavity 111), and may have a triangular shape including two sides parallel to the side 701 and the side 703, respectively. Furthermore, in an orthogonal projection to the surface 151, the concave portion 113 includes corresponding sides at positions that overlap two virtual lines extending from the two sides, of the electrode 112, respectively parallel to the side 701 and the side 703. As a result, as shown in FIG. 7A, each electrode 112 and each concave portion 113 that have a triangular shape are arranged. The corner of each electrode 112 and each concave portion 113 may be chamfered as shown in FIG. 7A. Also, each corner portion of the surface 151 (cavity 111) may also be chamfered. That is, the intersecting portion of the side 701 and the side 703 may be rounded, and the intersection portion of the side 702 and the side 703 may be rounded.

In addition, to ensure that the electrode 112 will be electrically connected to the surface 251 of the electronic device 200, the electrode 112 and the concave portion 113 may be arranged in a plurality of locations. That is, a plurality of combinations, each including of the electrode 112 and the concave portion 113, will be arranged on the surface 151 (cavity 111). For example, the combination of the electrode 112 and the concave portion 113 may be arranged in at least each of the two corner portions that face each other among the four corner portions of the rectangular surface 151 (cavity 111). At this time, the concave portion 113 of each of the two corner portions can be arranged between the electrode 112 arranged in one corner portion of the two corner portions and the electrode 112 arranged on the other corner portion of the two corner portions. Also, as shown in FIGS. 7A and 7B, the combination of the electrode 112 and the concave portion 113 may be arranged at each of the four corner portions (four corners) of the surface 151 (cavity 111). This can reduce the risk that each electrode 112 and the electronic device 200 will not be electrically connected to each other. At this time, as shown in FIG. 7A, in an orthogonal projection with respect to the surface 151, the area of each electrode 112 may be larger than the area of the terminal 114 for connecting to the external terminal 223 of the electronic device 200.

On the other hand, if the size of each of the electrode 112 and the concave portion 113 in the orthogonal projection to the surface 151 is too large, the flatness of the surface 151 for mounting the electronic device may degrade because the contraction balance at the time of firing will degrade, for example, in the case of a ceramic package. Also, if the size of each of the electrode 112 and the concave portion 113 in the orthogonal projection to the surface 151 is too small, the hole may become blocked during the execution of a hole opening process on the green sheet. Hence, the electrode 112 and the concave portion 113 need to have an appropriate size. More specifically, the length along each of the sides 701 and 703 of the electrode 112 may be about 1 mm to 10 mm per side, and the length along each of the sides 701 and 703 of the concave portion 113 may be about 0.5 mm to 3 mm. At this time, as shown in FIG. 7A, in an orthogonal projection with respect to the surface 151, the length of the electrode 112 in the direction in which the electrode 112 and the concave portion 113 are connected (for example, the direction in which the center of the electrode 112 and the center of the surface 151 are connected) may be longer than length of the concave portion 113.

Also, as shown in FIG. 7B, the terminal 114, for electrically connecting with the external terminal 223 on the electronic device 200 by using a wire such as a gold wire, is arranged outside (outer peripheral portion 105) of the electrode 112. Since there is a possibility that the wire cannot be connected to the terminal 114 or the connection reliability of the wire will degrade even if the wire can be connected if the conductive member 115 spreads to the terminal 114 during the wire bonding process, it is important to suppress the extrusion of the conductive member 115. Hence, the electrode 112 may be arranged at a position closer to the reference plane 155 (surface 152), by about 0.01 mm to 0.5 mm, than the surface for mounting the electronic device 200. That is, for example, the upper surface 131 of the electrode 112 may be arranged at the respective positions shown in FIGS. 3B, 5B, and 6B described above. In each of the arrangements shown in FIGS. 3B, 5B, and 6B, the electronic device 200 can be mounted on the upper surface 135 of the central portion 161 via a fixing member for fixing the electronic device 200.

Furthermore, to prevent the conductive member 115 from spreading to the terminal 114, the terminal 114 may be arranged away, from the reference plane 155 (surface 152), by about 0.1 mm to 2 mm from the surface on which the electronic device 200 is to be mounted. That is, as in the arrangement shown in FIGS. 6A, 6B, and 7B, the electronic device 200 may be mounted on the upper surface 135 of the central portion 161, and the terminal 114 may be arranged on the upper surface 136b of the outer peripheral portion 105b that is arranged at a position higher than the outer peripheral portion 105a which has the same height as the upper surface 135 of the central portion 161.

In addition, if the bottom surface 133 of the concave portion 113 is in a position closer to the reference plane 155 (surface 152) than the upper surface 131 of the electrode 112 by about 0.1 mm to 1 mm, the excessive portion of the conductive member 115 can be contained in the concave portion 113. These arrangements will allow the spread of the conductive member 115 to be controlled more easily.

Figure 8:
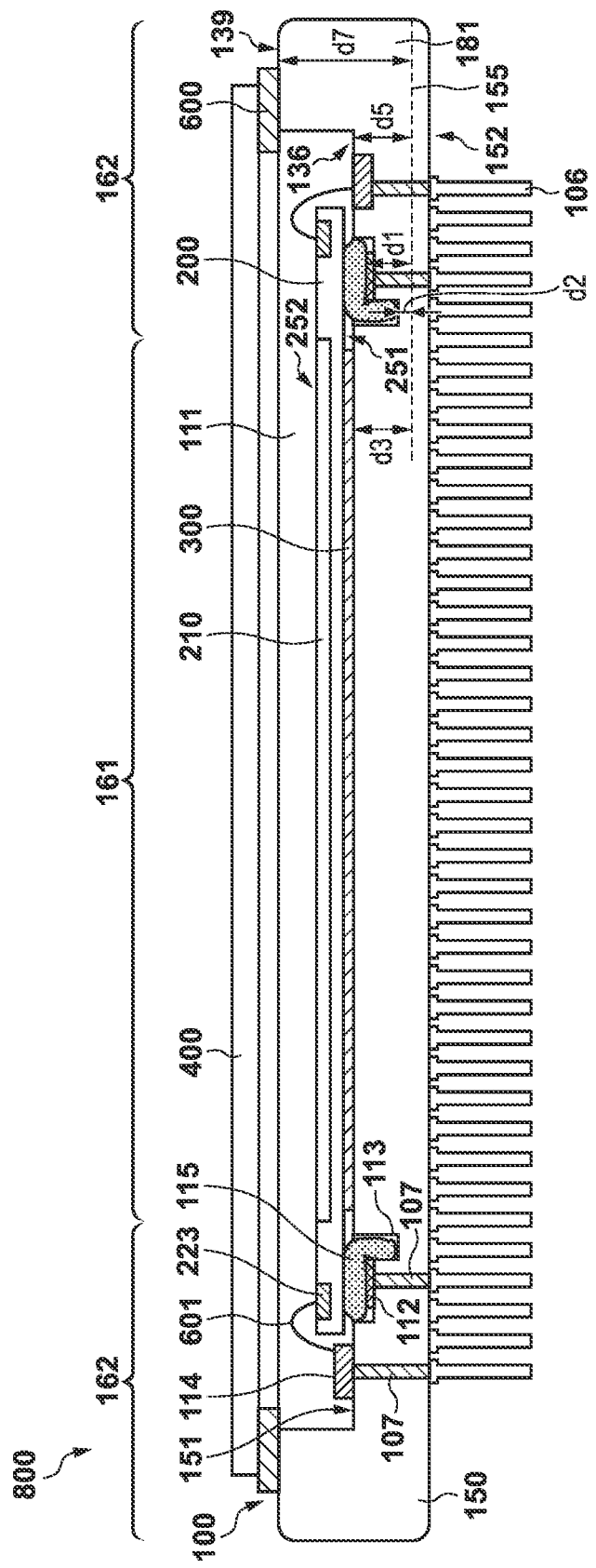
FIG. 8 is a sectional view showing an example of the arrangement of a semiconductor device using the package shown in FIG. 1.

Next, a semiconductor device that includes the above-described package 100 and the electronic device 200 mounted on the surface 151 of the package 100 will be described with reference to FIG. 8. Although the package 100 will use the arrangement shown in FIGS. 3A and 3B in FIG. 8, another above-described arrangement may also be used.

In this embodiment, a semiconductor device 800 includes the electronic device 200, a package including the surface 151 on which the electronic device 200 and the surface 152 on the side opposite to the surface 151, and a cover member 400 which covers the electronic device 200. The electronic device 200 is fixed to the central portion 161 of the surface 151 of the package 100 by a fixing member 300. The electronic device 200 and each electrode 112 of the package 100 are electrically connected by the conductive member 115 which uses a conductive adhesive agent. The cover member 400 is also a light transmitting member for protecting the electronic device 200 from mechanical impact and for preventing the entry of a foreign object such as dust to the cavity 111 of the package 100. The cover member 400 is bonded to a convex portion 181 provided on the peripheral portion 162 of the surface 151 by a fixing member 600 using an adhesive agent or the like. A distance d7 from the reference plane 155 to an upper surface 139 (upper surface of the convex portion) which is a surface on a side opposite to the side of the surface 152 of the convex portion 181 is longer than the distance d5 from the reference plane 155 to the upper surface 136 of the outer peripheral portion 105, of the peripheral portion 162, on which the terminal 114 is arranged. As a result, the cavity 111 can be sealed by the cover member 400.

The electronic device 200 may be a sensor chip in this case. In a case in which the electronic device 200 is a sensor chip, a sensor unit 210 in which a plurality of sensors for obtaining an image are arranged will be arranged on the surface 252, which is opposite to the surface 251 facing the package 100, of the surfaces included in the electronic device 200. Each sensor can also be referred to as a pixel. The sensors arranged in the sensor unit 210 may be sensors for detecting infrared light. Image signals generated by the sensors arranged in the sensor unit 210 are transmitted to the external terminals 106 via the external terminal 223 of the electronic device 200, the wire 601, the terminal 114 of the package 100, and each conductive member 107, and output outside the semiconductor device 800.

The purpose of connecting each electrode 112 of the package 100 to the electronic device 200 is to allow the charges that have accumulated in the electronic device 200 to escape outside the semiconductor device 800. More specifically, noise can be reduced by electrically connecting each electrode 112 and the substrate of the electronic device 200 to suppress the dark current in the sensor unit 210 and applying a voltage from each external terminal 106. Hence, the substrate (semiconductor) may be exposed on the surface 251 of the electronic device 200. Also, if the conductive member 115 that uses a conductive adhesive agent such as a silver paste or the like spreads below the sensor unit 210, there is a possibility that noise will be generated locally in an obtained image because of a local increase in the temperature due to the resistance of the conductive member 115. Hence, as shown in FIG. 8, in an orthogonal projection with respect to the surface 151 of the package 100, each electrode 112 and each concave portion 113 may be arranged in a position that does not overlap the sensor unit 210. As a result, it will be possible to suppress the conductive member 115 from spreading below the sensor unit 210.

Also, as described above, the distance d5 from the reference plane 155 to the upper surface 136 of the outer peripheral portion 105, of the surface 151 of the package 100, on which the terminal 114 is arranged may be longer than the distance d4 from the reference plane 155 to the portion on which the electrode 112 is arranged. As a result, it will be possible to suppress the conductive member 115 from extruding outside of the electronic device 200.

As described above, the electronic device 200 is formed by a semiconductor such as silicon or the like, and can be a sensor chip that includes an image capturing element such as a CMOS sensor or a CCD sensor which has been diced into a desired size by a dicer or the like. By undergoing a deposition process or an oxidizing process for manufacturing the electronic device 200, an insulating film such as a nitride film or an oxide film is formed on the lower surface of the electronic device 200, and the lower surface of the electronic device 200 has an electrically high resistance. Hence, when the electronic device 200 is to be mounted on the package 100, the surface 251 of the electronic device 200 may undergo a grinding process by backgrinding or the like or an etching process by a chemical such as a hydrofluoric acid or the like. As a result, the high resistance portion formed on the surface 251 of the electronic device 200 will be removed, and the surface 251 of the electronic device 200 and each electrode 112 of the package 100 will be able to be electrically connected.

In addition, a fixing member that has rubber elasticity such as a silicone adhesive agent or the like may be selected as the fixing member 300 for fixing the electronic device 200 to the package 100 to suppress warping of the electronic device 200 that is caused by a difference between the linear expansion coefficient (approximately 3 ppm/° C. in the case of silicon) of the electronic device 200 using a semiconductor substrate and the linear expansion coefficient (approximately 7 ppm/° C. in the case of a ceramic) of the package 100. In this case, the fixing member 300 is applied to a predetermined position on the package 100 by a screen printing method or a dispensing method, and will fix the electronic device 200 to the package 100 after the electronic device 200 has been mounted on the package and has undergone a heat curing process or the like.

A conductive adhesive agent capable of conductive-bonding by dispersing a conductive filler in an epoxy resin, an acrylic resin, or an urethan resin and causing the filler to form a conductive path after adhesion can be used as the conductive member 115. A metal powder of copper, nickel, silver, gold, or the like or a carbonaceous material such as graphite, carbon nanotubes, or the like can be used as the conductive filler. After the conductive member 115 has been applied on each electrode 112 of the package 100 by a screen printing method, a dispensing method, or the like and the electronic device 200 has been mounted on the package, the electrode 112 and the surface 251 of the electronic device 200 are bonded by executing a heat curing process or the like. If an adhesive agent that has rubber elasticity is used as the conductive member 115, the conductive member 115 can also be used as a fixing member to fix the electronic device 200 and the package 100. If the conductive member 115 does not have the desired rubber elasticity, the conductive member 115 and the fixing member 300 used for fixing the electronic device 200 and the package 100 can be used to bond the electrode 112 and the electronic device 200. At this time, consider a case in which the conductive member 115 is thin or a case in which the wetting and the spreading of the conductive member 115 have increased and caused a large linear expansion coefficient difference between the electronic device 200 and the package 100. In such cases, there is a possibility that the conductivity may become lost because the conductive member 115 may not be able to absorb the linear expansion coefficient difference between the electronic device 200 and the package 100 and the electronic device 200 and the package 100 may peel apart from each other at the time of a heat curing process or the like. However, since each of the arrangements of the above-described embodiment can be used to further control the thickness and the wetting and the spreading of the conductive member 115, the reliability of the semiconductor device 800 can be improved.

After the electronic device 200 has been fixed to the package 100, the terminal 114 of the package 100 and the external terminal 223 arranged on the surface 252 of the electronic device 200 are electrically connected via the wire 601. As result, the external terminal 223 of the electronic device 200 will be electrically connected to the corresponding external terminal 106 via the internal wiring pattern and the conductive member 107 of the package 100. A metal wire is used as the wire 601, and a gold wire, a silver wire, a copper wire, an aluminum wire, or the like can be used as the metal wire. The connection between the external terminal 223 and the terminal 114 by the wire 601 can be formed by performing thermosonic compression bonding using a known wire bonder.

Subsequently, to prevent an mechanical impact to the electronic device 200 and the wire 601 and to prevent the entry of a foreign object such as dust into the package 100, the cover member 400 is used to seal the cavity 111, of the package 100, on which the electronic device 200 has been mounted. In a case in which the electronic device 200 is a sensor chip as described above, a material that has a high optical transmittance can be used for the cover member 400. For example, glass, quartz, sapphire, or the like can be used as the cover member 400. AR coating or the like can be performed on the upper surface of the cover member 400 to further improve the light transmittance. In addition, an adhesive agent such as an epoxy resin, an acrylic resin, and the like can be used as the fixing member 600 for fixing the cover member 400 to the package 100. If these materials are sued as the fixing member 600, the cover member 400 will be fixed to the package 100 by executing UV curing, heat curing, or using both UV and heat for curing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-033756, filed Feb. 28, 2020 which is hereby incorporated by reference herein in its entirety.

What is claimed is:

1. A package comprising a base configured to mount an electronic device, wherein an electrode and a concave portion provided in the base are arranged on a first surface of the package, wherein the base comprises a second surface on a side opposite to the first surface and a third surface, and the first surface is positioned between the second surface and the third surface, wherein the electrode comprises an electrode upper surface that is a surface on a side opposite to the side of the second surface, and an electrode side surface that is a surface in a direction that intersects with a virtual plane between the first surface and the second surface, wherein the concave portion comprises a side surface of the concave portion, which is a surface in the direction that intersects with the virtual plane, and a bottom surface of the concave portion, which is positioned closer to the side of the second surface than the side surface of the concave portion, wherein the electrode upper surface is arranged at a position further away from the virtual plane than the bottom surface of the concave portion, wherein the electrode side surface is continuous with the side surface of the concave portion, wherein the concave portion further comprises a second side surface that faces the side surface of the concave portion and is continuous with the third surface, and wherein a distance from the virtual plane to a boundary of the side surface and the electrode side surface, in the direction that intersects with the virtual plane, is longer than a distance from the virtual plane to a part of the second side surface, in the direction that intersects with the virtual plane.

2. The package according to claim 1, wherein the base comprises a central portion and a peripheral portion,
wherein the electrode and the concave portion are arranged in the peripheral portion, and
wherein the concave portion is arranged between the electrode and the central portion.

3. The package according to claim 2, wherein the central portion comprises a central upper surface that is a surface on the side opposite to the side of the second surface, and
wherein a distance from the virtual plane to the central upper surface is longer than a distance from the virtual plane to the electrode upper surface.

4. The package according to claim 3, wherein an outer peripheral portion of the peripheral portion, which is further on a side opposite to the central portion than the electrode, comprises an outer peripheral upper surface that is a surface on the side opposite to the side of the second surface,
wherein a terminal configured to electrically connect to an external terminal, which is arranged on a surface opposite to a surface facing the first surface of the surfaces included in the electronic device, is arranged on the outer peripheral upper surface, and
wherein a distance from the virtual plane to the outer peripheral upper surface is equal to the distance from the virtual plane to the central upper surface.

5. The package according to claim 3, wherein an outer peripheral portion of the peripheral portion, which is further on a side opposite to the central portion than the electrode, comprises an outer peripheral upper surface that is a surface on the side opposite to the side of the second surface,
wherein the outer peripheral portion comprises a first outer peripheral portion in which a distance from the virtual plane to a first outer peripheral upper surface that is a surface on the side opposite to the second surface is longer than the distance from the virtual plane to the electrode upper surface, and a second outer peripheral portion in which a distance from the virtual plane to a second outer peripheral upper surface that is a surface on the side opposite to the second surface is longer than the distance from the virtual plane to the first outer peripheral upper surface, and
wherein a terminal configured to electrically connect to an external terminal, which is arranged on a surface opposite to a surface facing the first surface of the surfaces included in the electronic device, is arranged on the second outer peripheral upper surface.

6. The package according to claim 5, wherein the distance from the virtual plane to the first outer peripheral upper surface is equal to the distance from the virtual plane to the central upper surface.

7. A semiconductor device comprising:
a package according to claim 3; and
an electronic device that is mounted on the central upper surface.

8. The package according to claim 2, wherein an outer peripheral portion of the peripheral portion, which is further on a side opposite to the central portion than the electrode, comprises an outer peripheral upper surface that is a surface on the side opposite to the side of the second surface,
wherein a terminal configured to electrically connect to an external terminal, which is arranged on a surface opposite to a surface facing the first surface of the surfaces included in the electronic device, is arranged on the outer peripheral upper surface, and
wherein a distance from the virtual plane to the outer peripheral upper surface is not less than the distance from the virtual plane to the electrode upper surface.

9. The package according to claim 8, wherein, in an orthogonal projection with respect to the first surface, an area of the electrode is larger than an area of the terminal.

10. The package according to claim 1, wherein, in an orthogonal projection with respect to the first surface, a width of the concave portion, in a direction that intersects with a direction in which the electrode and the concave portion are connected, is the same or increases continuously or in stages in a direction from the electrode to the concave portion.

11. The package according to claim 1, wherein, in an orthogonal projection with respect to the first surface, a length of the electrode in a direction in which the electrode and the concave portion are connected is longer than a length of the concave portion in the direction in which the electrode and the concave portion are connected.

12. The package according to claim 1, wherein, in an orthogonal projection with respect to the first surface, the first surface has a rectangular shape including a first side and a second side parallel to each other and a third side extending in a direction that intersects with the first side and the second side, and the electrode is arranged in a corner portion of the first surface and has a triangular shape including two sides which are parallel to the first side and the third side, respectively.

13. The package according to claim 12, wherein in the orthogonal projection with respect to the first surface, the concave portion includes sides at respective positions that overlap two virtual lines extending from the two sides parallel to the first side and the third side.

14. The package according to claim 1, wherein a plurality of combinations, each including the electrode and the concave portion, are arranged on the base, and
wherein, in an orthogonal projection with respect to the first surface, the first surface has a rectangular shape, the combination is arranged in at least each of two corner portions that face each other among four corner portions of the first surface, and the concave portion, which is arranged at each of the two corner portions, can be arranged between the electrode, which is arranged in one corner portion of the two corner portions, and the electrode, which is arranged on the other corner portion of the two corner portions.

15. A semiconductor device comprising:
a package according to claim 1; and
an electronic device that is mounted on the first surface of the package.

16. A semiconductor device comprising an electronic device, a package including a first surface on which the electronic device is mounted, a second surface on a side opposite to the first surface, and a third surface, and a cover member configured to cover the electronic device,
wherein an electrode that comprises an electrode upper surface that faces the electronic device is arranged on the first surface,
wherein the first surface is positioned between the second surface and the third surface,
wherein the electrode is electrically connected, via a conductive member, to a surface, of surfaces included in the electronic device, which faces the first surface,
wherein the first surface includes the electrode and a concave portion, wherein the concave portion comprises a side surface of the concave portion, which is a surface in a direction that intersects with a virtual plane between the first surface and the second surface, a bottom surface of the concave portion, which is positioned closer to the side of the second surface than the side surface of the concave portion, and a second side surface, which faces the side surface of the concave portion and is continuous with the third surface, wherein the electrode upper surface is arranged at a position further away from the virtual plane than the bottom surface of the concave portion, wherein the conductive member flows into the concave portion, and wherein the cover member is bonded to a convex portion provided on a peripheral portion of the first surface.

17. The device according to claim 16, wherein the electrode is arranged in the peripheral portion, wherein, in an orthogonal projection with respect to the first surface, there is arranged on an outer peripheral portion of the peripheral portion, which is between the electrode and the convex portion, a terminal that is electrically connected by a wire to an external terminal, which is arranged on a surface opposite to a surface, of surfaces included in the electronic device, facing the first surface, wherein the outer peripheral portion comprises an outer peripheral upper surface, which is a surface on the side opposite to the side of the second surface, wherein the convex portion comprises an upper surface of the convex portion, which is a surface on the side opposite to the side of the second surface, wherein a distance from the virtual plane to the outer peripheral upper surface is longer than a distance from the virtual plane to the electrode upper surface, and wherein a distance from the virtual plane to the upper surface of the convex portion is longer than a distance from the virtual plane to the outer peripheral upper surface.

18. The device according to claim 17, wherein, in the orthogonal projection with respect to the first surface, the first surface comprises a central portion that is arranged closer to the side of a center than the electrode, wherein the central portion comprises a central upper surface that is a surface on the side opposite to the side of the second surface, wherein a distance from the virtual plane to the outer peripheral upper surface is longer than a distance from the virtual plane to the central upper surface, and wherein the distance from the virtual plane to the central upper surface is longer than the distance from the virtual plane to the electrode upper surface.

19. The device according to claim 16, wherein, in an orthogonal projection with respect to the first surface, the first surface comprises a central portion that is arranged closer to the side of a center than the electrode, wherein the central portion comprises a central upper surface that is a surface on the side opposite to the side of the second surface, and wherein a distance from the virtual plane to the central upper surface is longer than a distance from the virtual plane to the electrode upper surface.

20. The device according to claim 16, wherein a sensor unit in which a plurality of sensors configured to obtain an image are arranged is arranged on a surface opposite to the surface, of the surfaces included in the electronic device, which faces the first surface, and wherein, in an orthogonal projection with respect to the first surface, the electrode and the concave portion are arranged in a position that does not overlap the sensor unit.

21. A package comprising a base configured to mount an electronic device, wherein an electrode, a concave portion provided in the base, and a middle portion, which is formed by the base and is positioned between the electrode and the concave portion in an orthogonal projection with respect to a first surface, are arranged on the first surface of the package, wherein the base comprises a second surface on a side opposite to the first surface and a third surface, and the first surface is positioned between the second surface and the third surface, wherein the electrode comprises an electrode upper surface that is a surface on a side opposite to the side of the second surface, and an electrode side surface that is a surface in a direction that intersects with a virtual plane between the first surface and the second surface, wherein the concave portion comprises a side surface, of the concave portion, which is a surface in the direction that intersects with the virtual plane, and a bottom surface, of the concave portion, which is positioned closer to the side of the second surface than the side surface of the concave portion, wherein the middle portion comprises a middle upper surface that is a surface on the side opposite to the side of the second surface, wherein the electrode upper surface and the middle upper surface are arranged at a position further away from the virtual plane than the concave portion bottom surface, wherein a distance from the virtual plane to the middle upper surface does not exceed a distance from the virtual plane to the electrode upper surface, wherein a distance from the electrode to the concave portion is shorter than a length of the electrode in a direction in which the electrode and the concave portion are connected, and wherein the concave portion further comprises a second side surface that faces the side surface of the concave portion and is continuous with the third surface.

* * * * *